US006787886B1

United States Patent
Asakawa et al.

(10) Patent No.: US 6,787,886 B1
(45) Date of Patent: Sep. 7, 2004

(54) SEMICONDUCTOR DEVICE AND METHODS OF FABRICATING THE SAME

(75) Inventors: Kazuhiko Asakawa, Tokyo (JP); Wataru Shimizu, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/497,499

(22) Filed: Feb. 4, 2000

(30) Foreign Application Priority Data

Jul. 7, 1999 (JP) .......................................... 11/192584

(51) Int. Cl.[7] .............................................. H01L 29/06
(52) U.S. Cl. ...................... 257/632; 257/635; 257/637; 257/644; 257/650; 257/528; 257/529; 257/530
(58) Field of Search ................................ 257/635, 637, 257/644, 650, 52, 8–530; 438/132, 215

(56) References Cited

U.S. PATENT DOCUMENTS

| | | | | |
|---|---|---|---|---|
| 5,716,872 A | * | 2/1998 | Isobe ........................... | 437/195 |
| 5,808,363 A | * | 9/1998 | Watanabe .................... | 257/758 |
| 5,903,041 A | * | 5/1999 | La Fleur et al. ............ | 257/530 |
| 6,246,105 B1 | * | 6/2001 | Morozumi et al. .......... | 257/640 |

FOREIGN PATENT DOCUMENTS

| | | |
|---|---|---|
| JP | 1-208831 | 8/1989 |
| JP | 06021095 | 1/1994 |
| JP | 08046044 | 2/1996 |
| JP | 09069562 | 3/1997 |

OTHER PUBLICATIONS

Sorab K. Ghandhi; "VLSI Fabrication Principles, Silicon and Gallium Arsenide" (Second Edition); Copyright 1994; p. 528 and p. 725; A Wiley–Interscience Publication, John Wiley & Sons, Inc.

* cited by examiner

Primary Examiner—Long Pham
Assistant Examiner—Wai-Sing Louie
(74) Attorney, Agent, or Firm—Volentine Francos, PLLC

(57) ABSTRACT

A semiconductor device includes a semiconductor substrate which has a major surface and a MOS transistor which has a gate and first and second diffusion regions and which is formed on the major surface. The semiconductor device also includes a laminated structure of a SOG layer, wherein the laminated structure is composed of a base layer and a surface layer formed on the base layer and is formed over the MOS transistor and wherein the surface layer is denser than the base layer.

13 Claims, 4 Drawing Sheets

SEMICONDUCTOR DEVICE AND METHODS OF FABRICATING THE SAME

BACKGROUND OF THE INVENTION

1. Field of the Invention

The present invention generally relates to a semiconductor device and a method of fabricating the same, and more particularly, to a semiconductor device, such as a semiconductor integrated circuit device, having Spin On Glass film (it is called hereinafter SOG film) that is suitable for multilevel interconnection structure to achieve high integration and a method of fabricating thereof. This application is a counterpart of Japanese patent application, Serial Number 192584/1999, filed Nov. 7, 1999, the subject matter of which is incorporated herein by reference.

2. Description of the Related Art

In a multilevel interconnection technique of a semiconductor device, a multilevel interconnection structure can be obtained by forming an interlevel insulator between a lower wiring and an upper wiring, wherein the lower wiring is formed over a semiconductor substrate and the upper wiring is formed over the lower wiring. An integration of the semiconductor device can be improved by the multilevel interconnection structure.

In general an electrical junction part is formed in a contact hole which is provided in the interlevel insulator so as to expose an active region of the semiconductor substrate.

There is a self-alignment contact technique to provide such contact hole. This self-alignment technique is executed by following steps.

First, a pair of gate electrodes whose side surfaces and upper surfaces are covered with protection films, e.g., a silicon nitride film, is formed over a semiconductor substrate.

Next, an interlevel insulator is formed over the entire surface of the semiconductor substrate so as to cover the gate electrodes and the protection films.

Next, an etching mask having an opening is formed on a surface of the interlevel insulator so that the opening corresponds to an active region of the semiconductor substrate between the gate electrodes.

Then, an etching process is executed by using the etching mask to form a contact hole extending from the active region to an upper surface of the interlevel insulator. At this time, since the protection films have a high etching-resistance characteristic against an etching gas, or the like, the protection films are prevented from being etching. This means that the protection films function as an etching mask.

In the self-alignment contact technique, even though the etching mask is formed on a position which is slightly different from a desired position, the contact hole exposing the active region can be obtained because of a mask function of the protection film.

However, an anisotropic etching is used for a selective etching process using the etching mask wherein the anisotropic etching is an etching that an etching rate in a direction horizontal is relatively smaller than the etching rate in a direction vertical. Therefore, when a large amount of mask misalignment occurs, there is a possibility that an area of the exposed active region become smaller than an area having a desired value.

The reduction of the exposed active region causes an increase in the contact resistance between the exposed active region and a conductive part which is formed within the contact hole. This means also that electrical characteristics become uneven among contact holes.

In order to overcome such problems mentioned above, an idea that an isotropic etching is used for the selective etching instead of the anisotropic etching may arise. However, when only the isotropic etching is simply applied to the selective etching to form the contact hole in the interlayer insulator, it is difficult to control the area of the exposed active region and the depth of the contact hole. This means that a required contact hole is not obtained.

Another idea that both of the isotropic etching and the anisotropic etching is applied to the selective etching may also arise. However, it is not realistic that the interlayer insulator having single etching-resistance property is subjected to different kinds of etching methods, i.e., the isotropic etching and the anisotropic etching.

Consequently, there has been a need for a semiconductor device having improved electric characteristics and a method of fabricating the same.

SUMMARY OF THE INVENTION

It is an object of the present invention is to provide a semiconductor device and a method of fabricating the same that may improve electric characteristics among contact holes formed therein.

It is another object of the present invention is to provide a semiconductor device and a method of fabricating the same that may improve a moisture absorption property.

According to one aspect of the present invention, for achieving one or more of the above objects, there is provided a semiconductor device which includes a semiconductor substrate which has a major surface and a MOS transistor which has a gate and first and second diffusion regions and which is formed on the major surface. The semiconductor device also includes a laminated structure of a SOG layer, wherein the laminated structure is composed of a base layer and a surface layer formed on the base layer and is formed over the MOS transistor and wherein the surface layer is denser than the base layer.

According to another aspect of the present invention, for achieving one or more of the above objects, there is provided a method of fabricating a semiconductor device which includes forming a SOG layer over a MOS transistor formed on a semiconductor substrate; converting a surface portion of the SOG layer into to a dense layer which is denser than a bottom portion of the SOG layer, removing a first portion of the dense layer to expose a surface of the bottom portion of the SOG layer by a first etching, removing a second portion which corresponds to the exposed surface of the bottom portion of the SOG layer to expose a diffusion region of the MOS transistor by a second etching, and forming a conductive material within a space in which the first and second portions are removed.

The above and further objects and novel features of the invention will more fully appear from the following detailed description, appended claims and the accompanying drawings.

DETAILED DESCRIPTION OF THE PREFERRED EMBODIMENTS

First Preferred Embodiment

Figure 1:
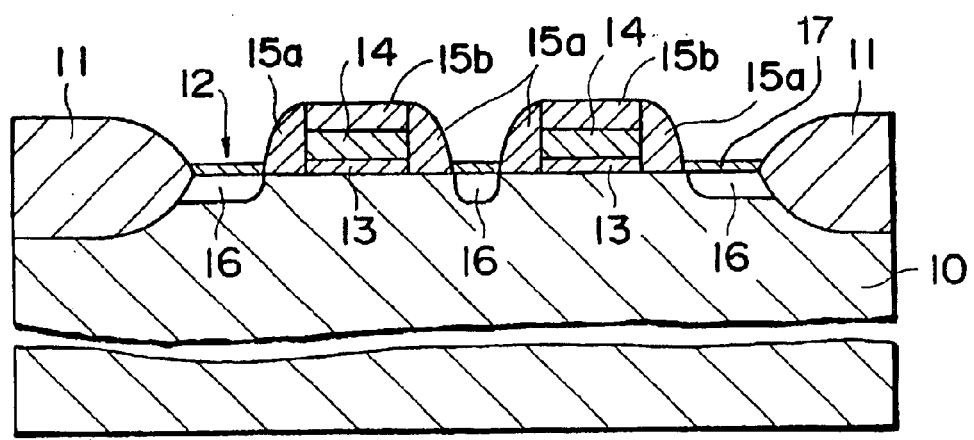
FIG. 1(a) through FIG. 1(c) are cross sectional views showing a semiconductor device according to a first preferred embodiment of the present invention
Figure 1:
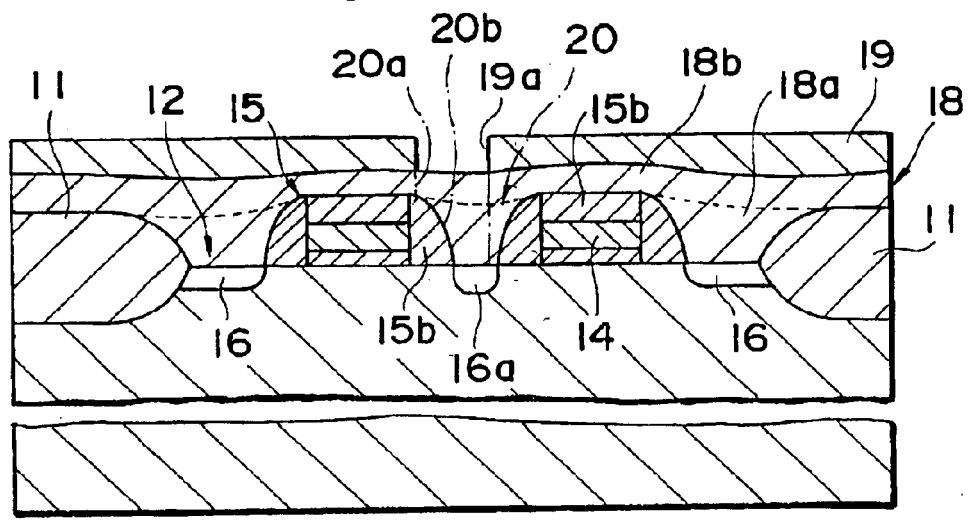
Figure 1:
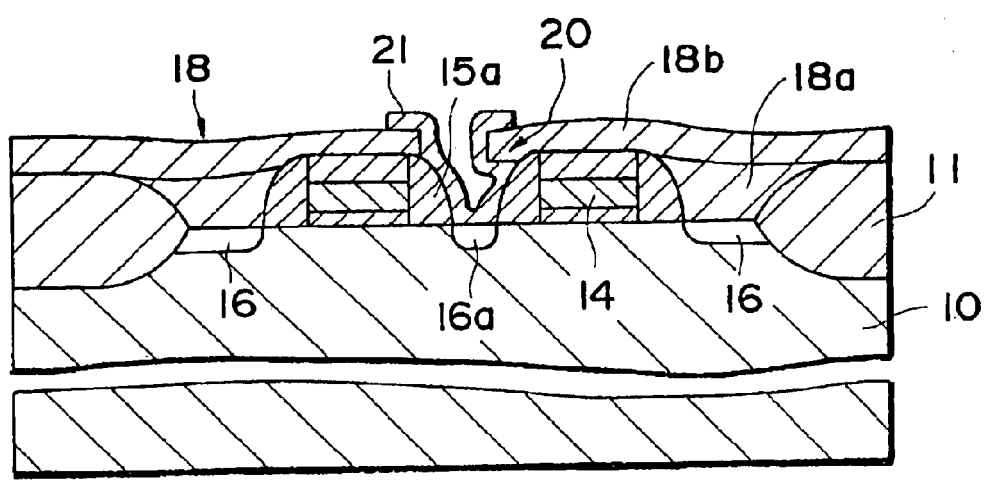

A semiconductor device according to preferred embodiment of the present invention will be explained hereinafter with reference to figures. In order to simplify explanations, like elements are given like or corresponding reference numerals through this specification and figures. Dual explanations of the same elements are avoided.

FIG. 1(a) through FIG. 1(c) are cross sectional views showing a semiconductor device according to a first preferred embodiment of the present invention FIG. 1 shows an example in which a SOG film substantially composed of two layers (The SOG film is also called hereinafter a lamination structure) is applied to a self-alignment contact technique. FIG. 1 includes fabrication steps for fabricating MOS transistor.

As shown in FIG. 1(a), an element isolation region 11 made of a field oxide is formed on a semiconductor substrate 10, e.g., a semiconductor material such as silicon, by using, for example, LOCOS (Local oxidation of silicon) technique. This element isolation region 11 defines active regions 12 on which active elements such as transistor or passive elements such as resistor are formed.

A pair of gate electrodes 14 is formed over the active region 12 through gate oxide films 13, and the gate electrodes 14 are arranged apart from each other, Protective films 15 (15a and 15b) made of silicon nitride are formed on upper and side surfaces of the gate electrodes 14. Such this structure is well known as the conventional self-alignment contact technique.

Impurity regions 16 served as source or drain regions are formed on the active region 12 adjacent to the gate electrodes 14. The impurity regions 16 are formed by using an ion implantation technique. At this time, the protective films 15 function as an ion implantation mask Furthermore, mask oxide films 17 are utilized in this ion implantation technique to prevent the active region 12 from being damaged due to the ion implanting. Such mask oxide film 17 is well known in this technical field. The mask oxide films 17 are removed by using etchant after the impurity regions 16 are formed In this embodiment, the etchant containing hydrofluoric acid which have concentration of 0.3 percent is used. The hydrofluoric acid is the principal ingredient in the etchant.

Next, as shown in FIG. 1(b), the mask oxide films 17 are removed. Then, a SOG film 18 (18a and 18b) is formed over the entire surface including the element isolation region 11, the active region 12, the gate electrodes 14, and protect films 15.

The SOG film 18 is formed by carrying out following steps. First, a silicon compound is dissolved in an organic solvent to obtain a SOG solution. Next, the obtained SOG solution is coated on the entire surface. Then, the coated SOG solution is baked and thus the SOG film 18 is finally obtained. Since the SOG film 18 is introduced as the interlayer insulator, the interlayer insulator having a planarized surface can be obtained even though step portions such as the gate electrodes 14 and the protect film 15 (15a and 15b) exist in the interlayer insulator. Therefore, upper wirings can be patterned on the SOG film 18 accurately without considering an error in a photolithography process, a break of wiring, or the like due to an uneven surface of the interlayer insulator.

Next, an ion such as Ar ion is implanted into the surface of the SOG film 18 and a portion adjacent to the surface of the SOG film 18 before providing a contact hole to expose the impurity region 16 located between the gate electrodes 14. Thus, the ion-implanted portion of the SOG film 18 is converted into a dense layer 18b. As a result, the laminated structure composed of a base layer 18a of ion non-implanted and a surface layer 18b (the dense layer) which is denser than the base layer 18a is finally obtained.

Such this ion implantation for obtaining the laminated structure of the SOG film is described in Japanese Laid Open Patent Number 69562/1997, published Mar. 11, 1997 in Japan. The publication states that the reason why the dense layer is formed by ion implantation in the SOG film. In the publication, the reason is that organic compositions in the SOG film 18 are decomposed, and moisture and hydroxyl group in the SOG film 18 are decreased because of the ion implantation Therefore, the ion which is used to obtain the dense layer in the SOG film 18 may be not only the argon but also a variety of ions. For example, an ion of fluoride such as silicon fluoride and boron fluoride, a boron ion, an nitrogen ion, an inert gas ion, any one of ions such as IIIb element ion, IVb element ion, Vb element ion, VIb element ion, VIIb element ion, IVa element ion, and Va element ion, or an ion of a compound made up of any mixture of at least two kinds of elements selected from IIIb element, IVb element, Vb element, VIb element, VIIb element, IVa element, and Va element may be used in the ion implantation That is, what kind of ions is used in the ion implantation depends on a process.

It is easy to control depth of ions to be implanted into the SOG film 18. Furthermore, this control is more accurate than a thermal diffusion technique. Consequently, the surface layer 18b having a desired thickness can be formed by controlling ion implantation energy. Since the surface layer 18b is denser than the base layer 18a, the surface layer 18b has higher etching-resistance.

Next, as illustrated in FIG. 1(b), a resist pattern 19 is formed on the surface layer 18b to carry out an etching process which utilizes the etching-resistance. The resist pattern 19 can be formed by a photolithography technique well known as a conventional technique.

The resist pattern 19 has an opening 19a provided on the surface of the surface layer 18b. The opening 19a is not located right above the impurity region 16a. That is, the opening 19a is shifted in the direction of the left against the impurity region 16a as illustrated in FIG. 1(b). An amount of this shift is relatively large. First, in spite of this shift, in order to obtain a contact hole exposing the impurity region 16a, a first etching hole 20a which extends from the surface of the surface layer 18b to the surface of the base layer 18a is formed in the surface layer 18b by using a dry etching process having an anisotropic property.

In this dry etching process for obtaining the first etching hole 29a, reactive gas such as $C_3F_3$, $CCl_4$, Ar, and the like are used. The protect film 15 (15a and 15b) made of silicon nitride has a higher etching rate to the etching gas than that of the dense surface layer 18b. This means that an etching selective rate is high. Therefore, the surface film 18b can be etched without providing any large damage to the protect film 15 because of the high etching selective rate.

Furthermore, such the etching gas described above has the anisotropic property to the dense surface layer 18b.

Consequently, the first etching bole 20a, which corresponds to the opening 19a, can be formed within the surface layer 18b accurately by using the selective etching process that the anisotropic dry etching uses the resist pattern 19 as the etching mask. The first etching hole 20a may extend in the base layer 18a unless penetrating through the base layer 18a.

After the etching hole 20a is formed, an exposed surface of the base layer 18a is subjected to an etchant such as hydrogen fluoride. The base layer 18a, the surface layer 18b, and the protect film 15 (15a and 15b) have etching rates to the etchant in that order. For, example, an etching rate of the hydrogen fluoride having concentration of 5% to the base layer 18a and an etching rate of the hydrogen fluoride having concentration of 5% to the surface layer 18b are 3000~4000 Å/min and 300~350 Å/min, respectively. An etching rate of the hydrogen fluoride having concentration of 5% to the protect film 15 is not more than that of the base layer 18b. Therefore, a second etching hole 20b can be formed at a position which extends from the first etching hole 20a, which is located at the base layer 18a, and which is located between the side walls 15a and 15b by a wet etching process using such the etchant At this time, the surface layer 18b and the protect film 15 (15a and 15b) are prevented from being damaged.

Furthermore, since the etchant has an isotropic property to the base layer 18a and the side walls 15a and 15b function as a mask which is often used in the self-alignment technique, a portion of the base layer 18a between the side walls 15a and 15b can be removed properly by the etchant having the isotropic property.

Therefore, even though the opening 19a is slightly shifted to the horizontal direction with respect to the impurity region 16a to be exposed, e.g., the left direction in FIG. 1(b), the impurity region 16a can be exposed by the second etching hole 20b so that its exposed surface has a desired area. That is, an etching hole 20 which exposes the desired area of the impurity region 16a can be formed by using the first etching hole 20a and the second etching hole 20b extending from the first etching hole 20a. Such this etching hole 20 is also called "a contact hole".

Next, as shown in FIG. 1(c), a conductive part 21, which is well known, is formed within the etching hole 20. As described above, the etching hole 19a can expose the desired area in the impurity region 16a even though the shift between the position of the opening 19a and the position of the impurity region 16a occurs. Therefore, it is possible to prevent the contact area between the conductive part 21 and the impurity region 16a from being reduced and from being uneven in entire surface of the semiconductor substrate 10 in spite of this shift.

A MOS transistor having the gate electrode 14 and a pair of impurity regions 16 and 16a formed on the side surfaces of the gate electrode 14 can be controlled a channel which occurs below the gate electrode 14 and between the impurity regions 16 and 16a, by controlling a voltage applied to the gate electrode 14. This is well known as a conventional technique.

In such this MOS transistor, a channel current controlled by the gate voltage flows into the conductive part 21. At this time, since the contact resistance between the conductive part 21 and the impurity region 16 can be set at substantially the same value on the entire semiconductor substrate 10, the uneven electric characteristics of the MOS transistors due to the uneven contact resistance can be improved Second Preferred Embodiments A semiconductor device according to a second preferred embodiment of the present invention will be explained hereinafter with reference to FIG. 2.

Figure 2:
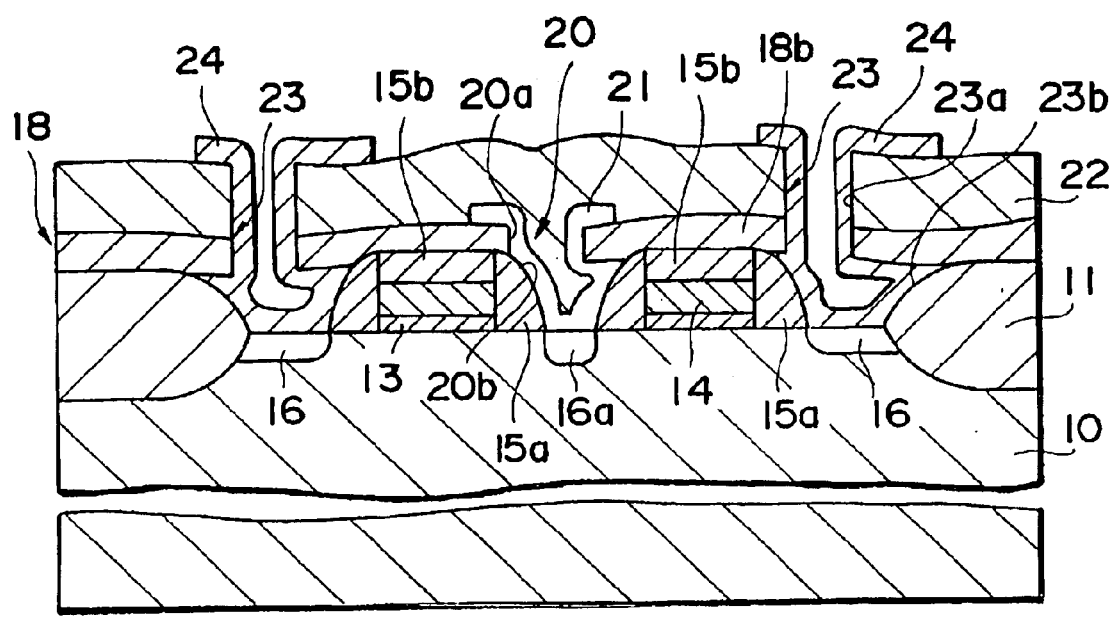
FIG. 2 is a cross sectional view showing a semiconductor device according to a second preferred embodiment of the present invention.

FIG. 2 shows an example in which the laminated structure of the present invention is applied to a semiconductor memory device such as a DRAM.

As shown in FIG. 2, the impurity regions 16 are formed on the active region 12 between gate electrodes 14 and formed on the active region 12 outside of the gate electrodes 14. A MOS transistor which functions as a switching element is composed of the gate electrode 14 and a pair of impurity regions 16 which is positioned on both sides of the gate electrode 14. In FIG. 2, two MOS transistors share one impurity region 16a A memory cell is made up of the MOS transistor having the gate electrode 14, the impurity region 16a, and the impurity region 16 and a capacitor associated with the impurity region 16.

The SOG film 18 having the laminated structure (18a and 18b) which is the same as that of the first preferred embodiment is formed over the gate electrodes 14 so as to cover the gate electrodes 14. The conductive part 21 as a bit line is formed between the gate electrodes 14. The conductive part 21 is the same as that of the first preferred embodiment. The two memory cells share conductive part 21. The conductive part 21 as the bit line can be formed in the same manner as explained in FIG. 1(a) through FIG. 1(c).

After that, as shown in FIG. 2, an interlevel insulator 22 made of CVD silicon oxide film is formed on the conductive part 21 and the SOG film 18.

Etching holes 23 which go through the interlevel insulator 22 and the SOG film 18 are formed in the interlevel insulator 22 and the SOG film 18 to expose the impurity regions 16. In the formation of the etching hole 23, the interlevel insulator 22 and the surface layer 18b are subjected to a selective etching process similar to that of the first preferred embodiment, which is the dry etching process having the anisotropic property. Fist etching holes 23a corresponding to an etching mask 19 of a resist pattern (not shown) are formed within the interlevel insulator 22 and the surface layer 18b by the dry etching process. This process is similar to that of the first preferred embodiment.

After forming the first etching holes 23a, the etching process is applied to the base layer 18a formed under the surface layer 18b of the SOG film 18 in the laminated structure.

The wet etching having the isotropic property is used in the etching process of the base layer 18a, wherein the etching process is substantially the same manner of the first preferred embodiment.

In this wet etching process, the element isolation region 11 of silicon dioxide film (thermal oxidation film) only has an etching rate which is equal to or slightly larger than that of the surface layer 18b.

Therefore, second etching holes 23b which expose the impurity regions 16 between the side walls 15a and the element isolation regions 11 are formed within the base layer 18a by the wet etching process. The second etching holes 23b are cavities having relatively large capacity.

Conductive parts 24 as a storage electrode of the capacitor are formed on side surfaces of the etching hole 23, wherein the side surfaces are defined by the first etching hole 23a and the second etching hole 23b.

In the second preferred embodiment, both of the dry etching process having the anisotropic property to the surface layer 18b and the wet etching process having the isotropic property to the base layer 18a are used for forming the etching hole 20 in which the conductive part 21 as the bit line is provided and for forming the etching hole 23 in which the conductive part 24 as storage electrode of the capacitor is provided.

The etching hole 20 for the conductive part 21 and the etching hole 23 for the conductive part 24 which expose desired area in the active region 12 (the impurity regions 16 and 16a) can be formed by using this two steps etching even though the mask shift occurs or the mask pattern has a circular shape or a rectangular shape.

In the present invention, the contact resistance between the bit lines and the impurity regions can be almost even in all of the contacts. Also the contact between the storage electrodes and the impurity regions can be almost even in all of the contacts. Therefore, DRAM having fine electric characteristics can be fabricated easily.

Using the hydrofluoric acid in the wet etching process having the isotropic property, and the protect film 15 (15a and 15b) is made of silicon nitride are shown as an example. However, any etching acid having the isotropic property other than the hydrofluoric acid may be used instead Any kind of materials which has a etching rate lower than that of the base layer 18a can be used as the protect film 15. These etching rates depend on the etching acid used in the wet etching process.

In the first and second preferred embodiments, utilizing the difference between the density of the base layer of the SOG film and the density of the surface layer of the SOG layer is explained as an example. In a third preferred embodiment of the present invention explained hereinafter, utilizing the difference between a coefficient of moisture absorption of the base layer in the SOG film and a coefficient of moisture absorption of the surface layer in the SOG film will be explained as an example.

Third Preferred Embodiment

A semiconductor device according to a third preferred embodiment of the present invention will be explained hereinafter with reference to FIG. 3(a) through FIG. 3(C) and FIG. 4.

Figure 3:
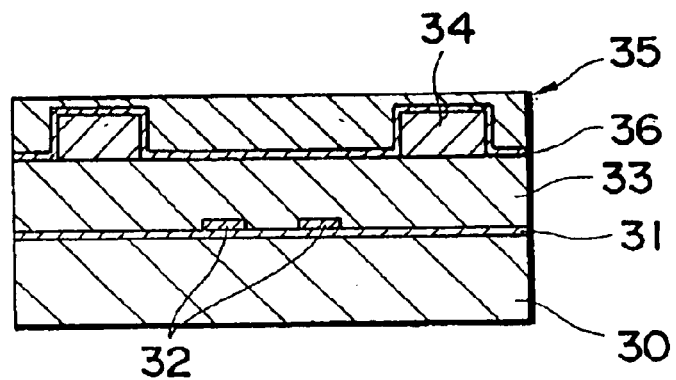
FIG. 3(a) through FIG. 3(c) are cross sectional views showing a semiconductor device according to a third preferred embodiment of the present invention.
Figure 3:
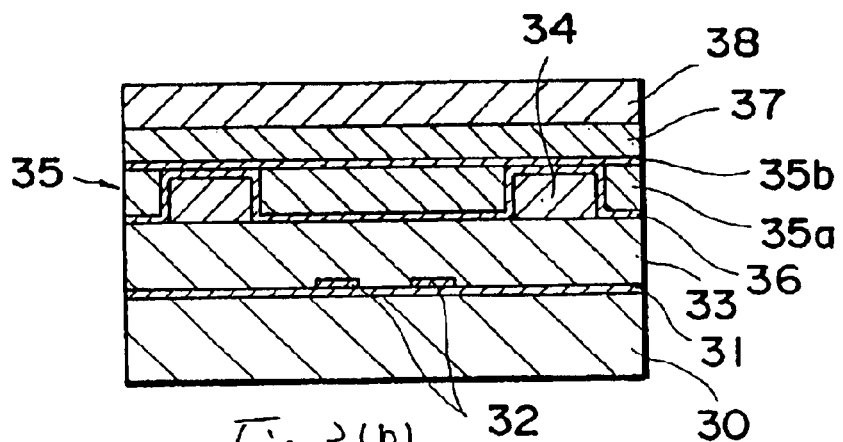
Figure 3:
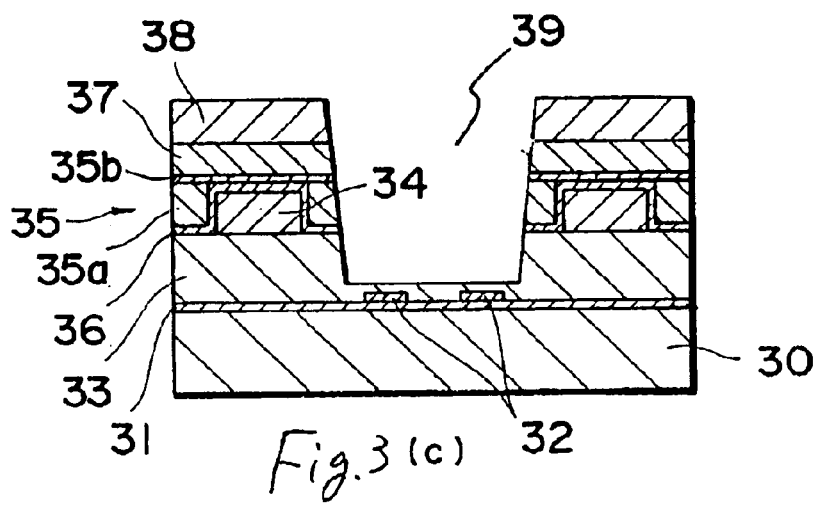
Figure 4:
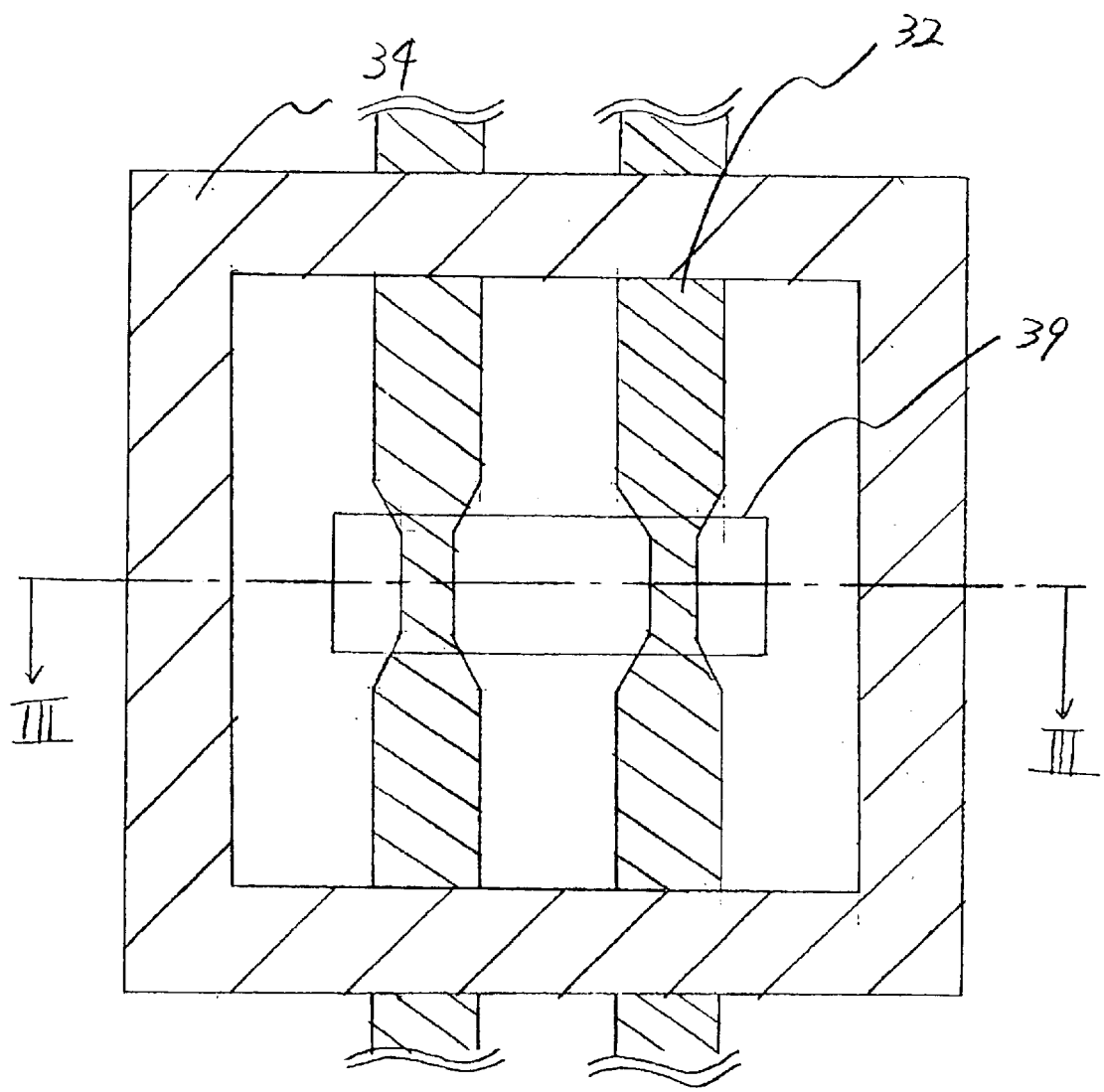
FIG. 4 is a schematic cross sectional view of FIG. 3(c).

FIG. 3(a) through FIG. 3(c) show an example in which the laminated structure of the present invention is applied to a semiconductor device such as a semiconductor memory. FIG. 4 is a schematic cross sectional view of FIG. 3(c).

A redundant circuit having a redundant memory cell which is substituted for a defective memory cell is provided in the semiconductor device such as DRAM. A selecting circuit for carrying out a substitution operation (it is also called a replacing operation) that the redundant memory cell is substituted for the defective memory cell is also incorporated in the semiconductor device. Laser brown fuses are incorporated in this selecting circuit. The substitution operation is achieved by blowing the laser blown fuses.

FIG. 3(a) through FIG. 3(c) show fabrication steps of the semiconductor device in which the laser blown fuses for the redundant circuit are incorporated.

Referring to FIG. 3(a), the laser blown fuses 32 for the redundant circut are formed over a semiconductor substrate 30 through an insulator 31. The insulator 31 is made of silicon oxide film formed by using, for example, a CVD method. The fuse 32 is preferably made of tungsten silicide layer having 150 nm in thickness.

An insulator 33 which is made of silicon oxide film is formed on the fuses 32 and the insulator 31 so as to cover the fuses 32.

A tungsten layer having 500 nm in thickness is deposited on the insulator 33 by using the CVD method. Photolithography and etching are applied to the deposited tungsten layer. Thus, wings for selecting circuit, wirings for bit lines, or the like are obtained. Furthermore, a dummy layer 34 is obtained by the deposited tungsten layer. As illustrated in FIG. 4, the dummy layer 34 has a frame shape and is formed on the insulator 33 so as to surround a region where the fuses 32 are located. The dummy layer 34 prevents moisture from being introducing into an internal circuit of the semiconductor device.

A SOG layer 35 which relates to the present invention is formed over the wirings including fuses 32. An insulator 36 which has 500 nm in thickness and covers the dummy layer 34 is formed on the insulator 33 and the dummy layer 34 in order to improve degree of adhesion between the SOG layer 35 and the dummy layer 34. The insulator 36 is formed by using plasma CVD method.

After forming the insulator 36, the SOG film 35 covering the dummy layer 34 and the insulator 36 is obtained by following manner. First, a silicon compound is dissolved in an organic solvent to obtain a SOG solution. Next, the obtained SOG solution is coated on the entire surface. Then, the coated SOG solution is baked at about 300° C. and thus the SOG film 35 is finally obtained. The SOG layer 35 has a relatively high coefficient of moisture absorption.

After that, the surface of the SOG layer 35 is subject to the ion implantation as explained above. The surface of the SOG film 35 located above the dummy layer 34 is converted into a surface layer 35b as a dense layer. The surface layer 35b is relatively denser than a base layer located under the surface layer 35a. As a result, as illustrated in FIG. 3(b), the SOG film 35 is converted into the laminated structure which is composed of the surface layer 35b as a denser layer and the base layer 35a having relatively higher moisture absorption property than the surface layer 35b.

The surface layer 35b located above the dummy layer 34 and the dummy layer 34 function as a dam for preventing moisture from passing therethrough.

Next, the insulator 37 and a cover film 38 as explained hereinafter, each of which has a coefficient of moisture absorption relatively lower than that of the SOG layer 35, are formed over the insulator 37 and the cover film 38.

When the SOG film 35 having the relatively high moisture absorption property exists between the top surface of the dummy layer 34 and the insulator 37, the SOG film 35 may act as a path through which the moisture passes. In the conventional technique, the SOG film 35 located between the top surface of the dummy layer 34 and the insulator 37 is removed by etching back the entire surface of the SOG film 35 to overcome the moisture passing problem. Then, the insulator 37 and the cover film 38 are formed over the etched surface of the SOG film 35.

In this preferred embodiment of the invention, the insulator 37 and the cover film 38 can be formed over the surface layer 35b of the SOG film 35 without etching back the SOG film 35.

The insulator 37 is made of, for example, a plasma oxide film having about 400 nm in thickness and can be formed by using the plasma CVD method The cover film 38 has about 1000 nm in thickness as well known in this technical field and can be formed by using the CVD method.

Contact holes which expose surfaces of wirings located under corresponding contact holes are formed within the insulator 37. (not shown in FIG. 3(a) through FIG. 3(c) and FIG. 4) Conductive parts are formed within the corresponding contact holes.

Next, after forming the insulator 37 and the cover film 38, an opening 39 extending from the surface of the cover film 38 to a position adjacent to the fuses 32 is formed by using a selective etching process. The opening 39 functions as a laser blow window for blowing the fuses 32. Thus, blowing the fuses 32 by the laser beam can be achieved easily.

The SOG film 35 of relatively high moisture absorption property are exposed at edges of the opening 39 due to the formation of the opening 39. However, since the efficient of the moisture absorption of the surface layer 35b located on the top surface of the dummy layer 34 is reduced by the ion implantation, both of the surface layer 35b and the dummy layer 34 function as the effective dam against the moisture which is entered into the semiconductor device at the edges of the opening 39. Therefore, a moisture cutting off structure accurately functioning as the dam can be obtained without etching back the SOG film.

In the third preferred embodiment of the present invention, applying the moisture cutting off structure which is comprised of the laminated structure and the dummy layer to the redundant circuit of the memory device is explained. However, the moisture cutting off structure of the present invention can be applied to any moisture cutting off structures, for example, an opening associated with a grid line, an edge portion of a semiconductor chip having a multilevel wiring structure, or the like.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor device comprising:
   a semiconductor substrate which has first and second regions formed on a major surface thereof;
   a first insulating layer which is formed over the first region;
   a dummy pattern which has a predetermined shape and which is formed on said first insulating layer;
   a first SOG layer which is formed on side surfaces of said dummy pattern and the first insulating layer;
   a second SOG layer which is formed on a top surface of said dummy pattern and said first SOG layer, said second SOG layer being denser than said first SOG layer; and
   a second insulating layer which is formed on said second SOG layer;
   wherein said first and second insulating layers and said first and second SOG layers are exposed at a boundary between the first region and the second region.

2. A semiconductor device as set forth claim 1, wherein the second region is a grid line.

3. A semiconductor device as set forth claim 1, further comprising a fuse element which is formed over the second region.

4. A semiconductor device comprising:
   a semiconductor substrate which has first and second regions formed on a major surface thereof, the second region surrounding the fist region;
   a first insulating layer which is formed over the second region;
   a dummy pattern which has a frame shape surrounding the first region and which is formed on said first insulating layer;
   a first SOG layer which is formed on side surfaces of said dummy pattern and the first insulating layer;
   a second SOG layer which is formed on a top surface of said dummy pattern and said first SOG layer, said second SOG layer being denser than said first SOG layer; and
   a second insulating layer which is formed on said second SOG layer;
   wherein said first and second insulating layers and said first and second SOG layers are exposed at a boundary between the first region and the second region.

5. A semiconductor device as set forth claim 4, further comprising a fuse element which is formed over the first region.

6. A semiconductor device as recited in claim 1, wherein said second SOG layer further includes ions chosen from the group consisting essentially of:
   argon; fluorine; nitrogen; IIIb-element; IVb-element; Vb-element; VIb-element; VIIb-element; IVa-element; and Va-element.

7. A semiconductor device as recited in claim 4, wherein said second SOG layer further includes ions chosen from the group consisting essentially of: argon; fluorine; nitrogen; IIIb-element; IVb-element; Vb-element; VIb-element; VIIb-element; IVa-element; and Va-element.

8. A semiconductor device as recited in claim 3, wherein said fuse element is a laser blown fuse element.

9. A semiconductor device as recited in claim 5, wherein said fuse element is a laser blown fuse element.

10. A semiconductor memory device, comprising:
    a semiconductor substrate, which has a first region and a second region formed on a major surface thereof;
    a first insulating layer, which is formed over the first region;
    a dummy pattern, which has a predetermined shape, and which is formed on said first insulating layer;
    a first SOG layer, which is formed in side surfaces of said dummy pattern and said first insulating layer;
    a second SOG layer, which is formed on a top surface of said dummy pattern and said first SOG layer, said second SOG layer being denser than said first SOG layer; and
    a second insulating layer, which is formed on said second SOG layer, wherein said first and second insulating layers and said first and second SOG layers are exposed at a boundary between the first region and the second region.

11. A semiconductor memory device as recited in claim 10, wherein the memory device is a DRAM.

12. A semiconductor memory device as recited in claim 11, further comprising a redundant circuit having a redundant memory cell.

13. A semiconductor memory device as recited in claim 11, further comprising a plurality of laser blown fuses.

* * * * *